United States Patent [19]
Hamm et al.

[11] Patent Number: 5,907,165
[45] Date of Patent: May 25, 1999

[54] INP HETEROSTRUCTURE DEVICES

[75] Inventors: Robert Alan Hamm, Staten Island, N.Y.; Rose Fasano Kopf, Green Brook, N.J.; Robert William Ryan, Piscataway, N.J.; Alaric Tate, Chatham, N.J.

[73] Assignee: Lucent Technologies Inc., Murray Hill, N.J.

[21] Appl. No.: 09/071,006

[22] Filed: May 1, 1998

[51] Int. Cl.[6] .................. H01L 31/0328; H01L 31/0336; H01L 31/072; H01L 31/109

[52] U.S. Cl. .......................... 257/197; 257/198; 257/623; 257/751

[58] Field of Search ..................... 257/197, 198, 257/623, 751

[56] References Cited

U.S. PATENT DOCUMENTS

| | | | |
|---|---|---|---|
| 5,001,534 | 3/1991 | Lunardi et al. | 357/34 |
| 5,036,372 | 7/1991 | Ohishi et al. | 357/16 |
| 5,719,415 | 2/1998 | Yagura et al. | 257/191 |
| 5,729,033 | 3/1998 | Hafizi | 257/198 |

*Primary Examiner*—William Mintel

[57] ABSTRACT

The specification describes a metal contact material optimized for diffused contacts to the buried emitter-base junction in DHBT devices. The metal contact material is a multilayer structure of Pd-Pt-Au which gives the required critical diffusion properties for low resistance contacts to the buried base layer without shorting to the collector layer.

9 Claims, 7 Drawing Sheets

INP HETEROSTRUCTURE DEVICES

FIELD OF THE INVENTION

This invention relates to the manufacture of heterostructure devices such as Double Heterostructure Bipolar Transistors (DHBT).

BACKGROUND OF THE INVENTION

High efficiency double heterostructure bipolar transistor devices are frequently made with the junctions clad by thin graded quaternary regions. In this structure the junctions are buried for improved device reliability. In the manufacture of these devices, the multilayer stack is first grown, then electrical contacts to the buried base and collector are made by forming mesas to give physical access to the base and collector layers. The contact to the base emitter junction is formed by diffusion of the contact metal through the thin graded quaternary layer between the base and emitter layers. Because the diffusion process is subject to so many variables, low resistance contacts to the base are difficult to form without punch-through to the collector layer. Efforts to avoid punch-through to the collector may result in too shallow diffusion of the metal contact material, with a resultant high resistance or non-ohmic contact. Therefore control of the diffusion depth of the metal contact layer is critical.

STATEMENT OF THE INVENTION

It has been found that the diffusion properties of metal contact materials through quaternary layers in an InP based multilayer DHBT structure vary significantly, and an understanding of the metallurgy of contact materials and the III-V semiconductors leads to a proper choice of the contact material and improves substantially the quality and yield of emitter base contacts in these devices. It was found that the multilayer system Pd-Pt-Au, with the individual layers within a critical thickness range, gives superior electrical performance.

DETAILED DESCRIPTION

The base-emitter metal contact systems of the invention were evaluated in the context of the overall process for the fabrication of III-V DHBT devices, and the advantages and unexpected results of the metal system, and the device fabrication process of the invention, were demonstrated with electrical measurements on those devices. However, it will be appreciated by those skilled in the art that the contact technique may have broader application to other III-V multilayer heterostructure devices that require contacts to buried layers.

Figure 1:
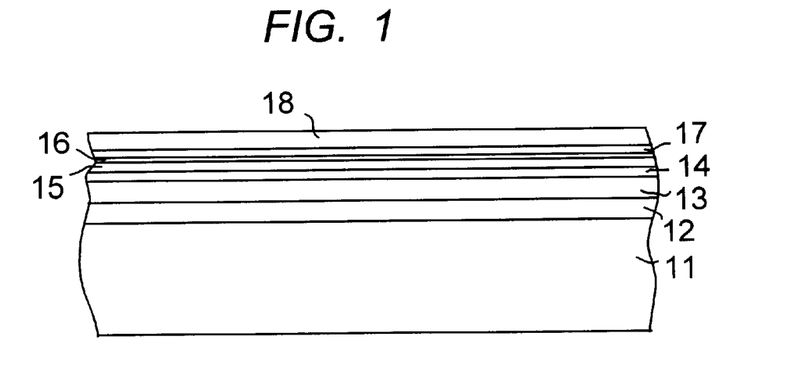
FIGS. 1–11 are schematic representations of the steps in the manufacture of double heterostructure bipolar transistors of the invention.

Referring to FIG. 1, a multilayer heterostructure stack is shown as a portion of a larger overall semiconductor wafer. The multilayer stack may be grown by Metal-Organic Molecular Beam Epitaxy ( MO-MBE ) using standard growth techniques as known in the art. A general description of the MO-MBE process can be found in M. B. Panish and H. Temkin, "Gas Source Molecular Beam Epitaxy", Chapter 4, Springer Series in Materials Science, Vol. 26, Springer-Verlag 1993, which is incorporated herein by reference for details of the process. The MBE growth technique is ideal for making heterostructures because very complex multilayer stacks can be produced in a substrate wafer in a series of sequential growth steps in a vacuum apparatus without breaking the vacuum and handling the wafer. Thus all of the layers in the stack are completed before the device fabrication sequence begins.

The multilayer stack shown in FIG. 1 is adapted for a double heterostructure bipolar transistor. The substrate layer 11 is semi-insulating InP on which a series of semiconductor layers 12–18 are sequentially grown. Some of these layers comprise a sub-series of graded layers as will be described. However, for clarity and simplicity in the description only the seven functional layers are shown. In the context of processing the multilayer stack, the layers that comprise graded sub-layers are processed as if they were a single layer.

The first grown layer 12 is a 4000 Angstrom $In_{0.53}Ga_{0.47}As$ subcollector layer doped $n^+$ with a dopant concentration of $3 \times 10^{19}$ cm$^{-3}$. The n-type dopant used in this process was Sn, although other n-type impurities such as Si can be used. The subcollector layer 12 also includes buffer layers to prevent updiffusion of impurities in the multilayer structure. The buffer layers comprise a 200 Å $In_{0.53}Ga_{0.47}As$, n-doped at a level of $1 \times 10^{18}$ cm$^{-3}$, and a 20 Å undoped $In_{0.53}Ga_{0.47}As$ layer. The collector layer 13 is a 4000 Å layer of n-InP doped to a concentration of $3 \times 10^{16}$ cm$^{-3}$.

In the heterostructure transistor described here, both the emitter-base and collector-base regions are graded using graded quaternary InGaAsP layers. The graded quaternary layers separating the collector and base is shown at 14, and comprise a 130 Å InGaAsP (1.13 eV) layer, and a 130 Å InGaAsP (0.95 eV) layer. The quaternary layers had a doping level of $1 \times 10^{17}$ cm$^{-3}$. Buffer layers comprising a 300 Å $In_{0.53}Ga_{0.47}As$ layer n-doped to $1 \times 10^{17}$ cm$^{-3}$, and a 200 Å undoped $In_{0.53}Ga_{0.47}As$ layer, separate the graded layer 14 from the base layer 15. The base layer 15 is 200–1000 Å of $In_{0.53}Ga_{0.47}As$ doped to a concentration of $3 \times 10^{19}$ cm$^{-3}$ with carbon. The emitter side of the base also has a quaternary graded layer 16, made up of a 70 Å of InGaAsP (0.95 eV) layer, and a 70 Å InGaAsP (1.13 eV) layer. The emitter layer 17 is 500 Å of InP n-doped to a concentration of $5 \times 10^{17}$ cm$^{-3}$. The top semiconductor layer 18 is a contact layer consisting of 2500 Å of $In_{0.53}Ga_{0.47}As$ doped n-type with a concentration of $3 \times 10^{19}$ cm$^{-3}$.

Figure 2:
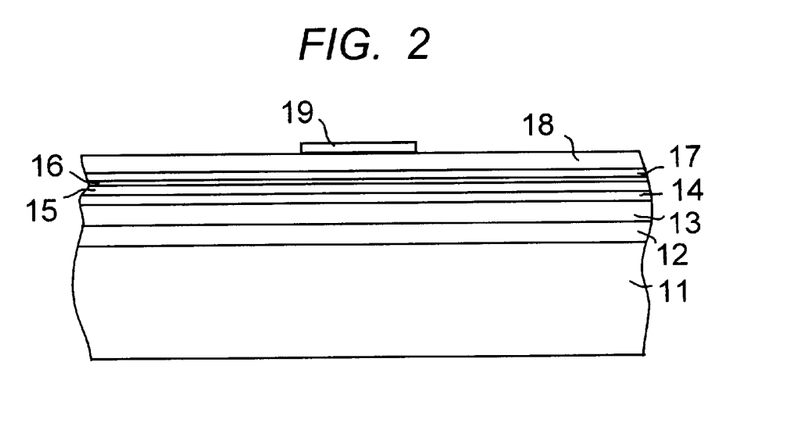
Figure 3:
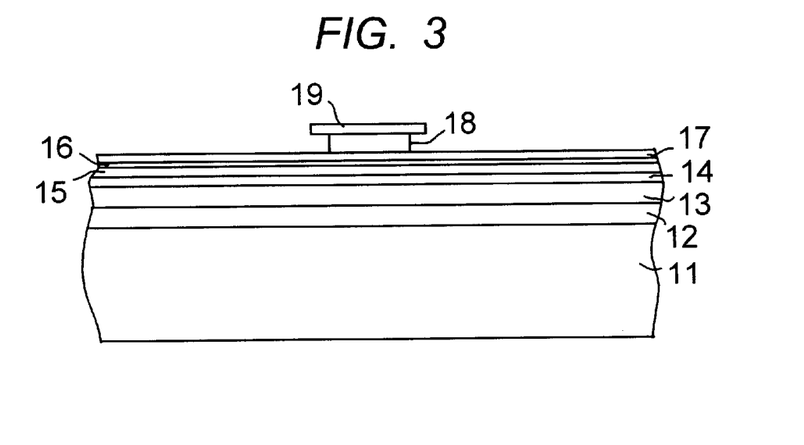
Figure 4:
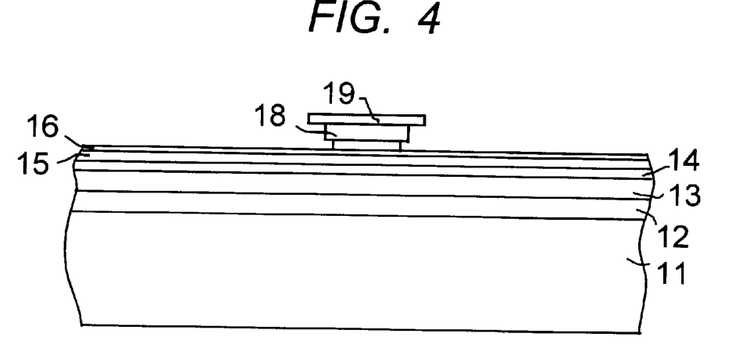
Figure 5:
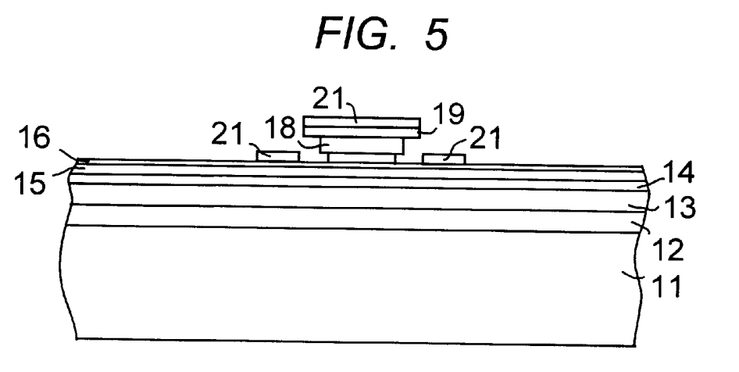

The fabrication sequence for the device is as follows. With reference to FIG. 2, a metal contact 19 is selectively applied to the semiconductor contact layer 18 by a lift-off technique. The metal contact 19 is 50 Å Pd+350 Å Pt+1000 Å Au, and during fabrication serves as an etch mask in a self-aligning mode. The lateral dimensions of the metal layer are approximately 3×5 μm. The top contact layer 18 is etched as shown in FIG. 3 using the metal contact layer 19 as an etch mask. A wet etchant is used. An overetch is performed to obtain an undercut of 5000 Å under the metal contact, leaving an area of approximately 2×4 μm in InGaAs contact layer 18. This patterned contact 18 then serves as the etch mask for the emitter layer 17 as shown in FIG. 4. The InP emitter layer is then wet etched. With reference to FIG. 5, the base contact 21 is applied by evaporating the base contact metal using the metal contact 19 as a shadow mask to define the inner edge of the base contact.

Figure 6:
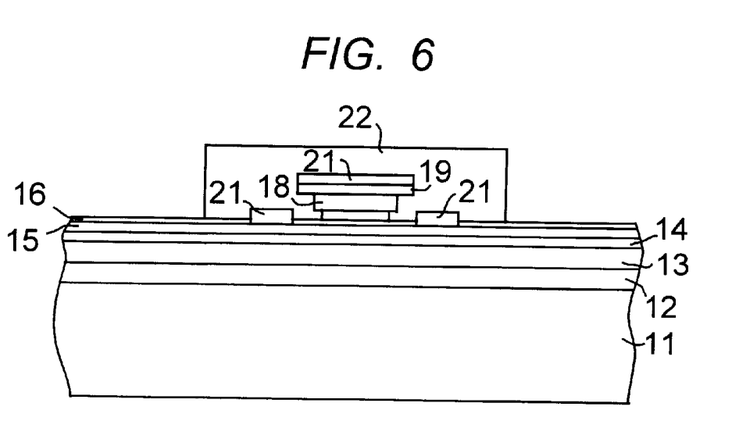

The structure is then encapsulated and the encapsulant 22 patterned as shown in FIG. 6 to define the mesa. The encapsulant is applied by spinning a suitable material such as Accuglass™ 211 at 2000 RPM onto the surface to produce a 0.26 μm layer of polymer encapsulant, and curing the polymer by heating to 300° C. for 10 min. During curing of the spin-on polymer the metal base contact is annealed sufficiently to diffuse the multilayer contact material through the thin quaternary graded layer 16 and make ohmic contact to the base layer 15. In a typical process sequence the encapsulant is applied in two or more, e.g. three, steps and the total anneal time is therefore some small multiple of 10 min., e.g. 30 min.

Figure 7:
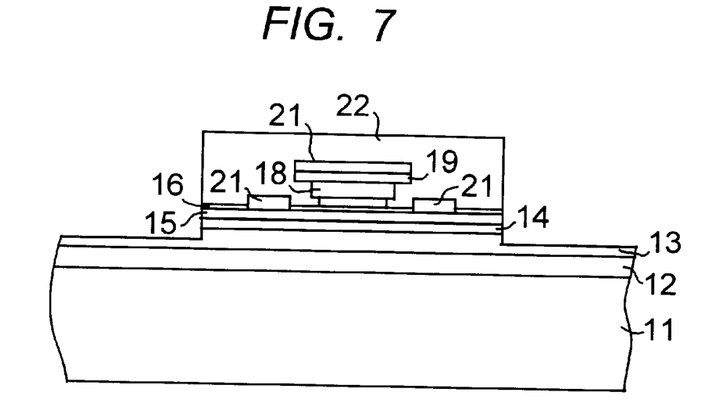

The exposed portions of the graded quaternary layer 16 for the emitter-base region, the base layer 15, the graded quaternary layer 14 for the base-collector region, and approximately half the thickness of the collector layer 13, are all sequentially ECR plasma etched using $BCl_3/N_2$. The structure resulting after this plasma etch is shown in FIG. 7. The remaining thickness of collector layer 13 is selectively wet etched, and overetched to produce a substantial, e.g. 2 μm, undercut as shown. This undercut serves to reduce the collector-base capacitance of the device.

The use of both wet and dry etching in the process allows the advantages of both techniques to be realized. Plasma etching is convenient, and wet etching is rapid and more selective. Moreover, using a wet etch following a plasma etch tends to remove surface damage caused by plasma exposure. The plasma etch steps in this work used ECR plasma processing in a Plasma-Therm SLR 770 system. Etching is performed at room temperature, at a bias of −80 V d.c., a μ-wave power of 250 W, and a pressure of 2 mTorr. Flow rates in sccm are 12 $BCl_3$+3 $N_2$. Plasma etch rates are about 150 Å/min for this etch chemistry. Selective wet etching is performed at 4° C. with 1:1:15 $H_3PO_4$:$H_2O_2$:$H_2O$, for InGaAs and 1:1:1 HCl:$H_3PO_4$:$H_2O$, for InP. Etch rates are 1000 Å/min and 800 Å/min, respectively.

Figure 8:
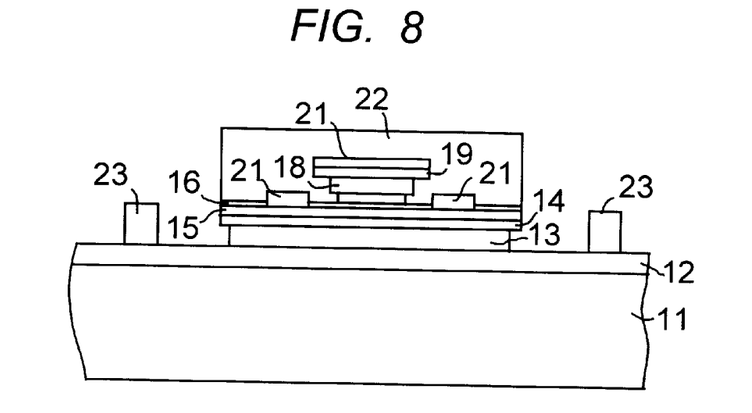
Figure 9:
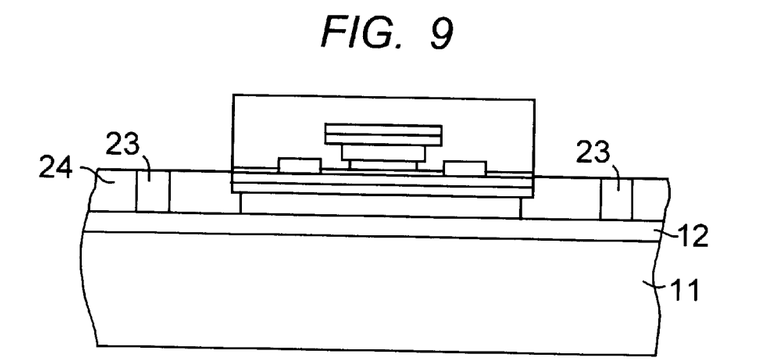

The collector contact layer 2 is then patterned (not shown) leaving an edge portion thereof accessible for the deposition of collector contact 23 as shown in FIG. 8. The collector contact is 50 Å Pd+350 Å Pt+6000 Å Au. The finished mesa structure is then passivated and encapsulated with a common layer, i.e. a polymer encapsulant Due to the thickness required to cover the mesa and the emitter and base contacts, i.e 1 μm, the encapsulant is applied in two steps. The first encapsulant application is shown in FIG. 9, with encapsulant layer 24 essentially covering the collector-base mesa structure.

Figure 10:
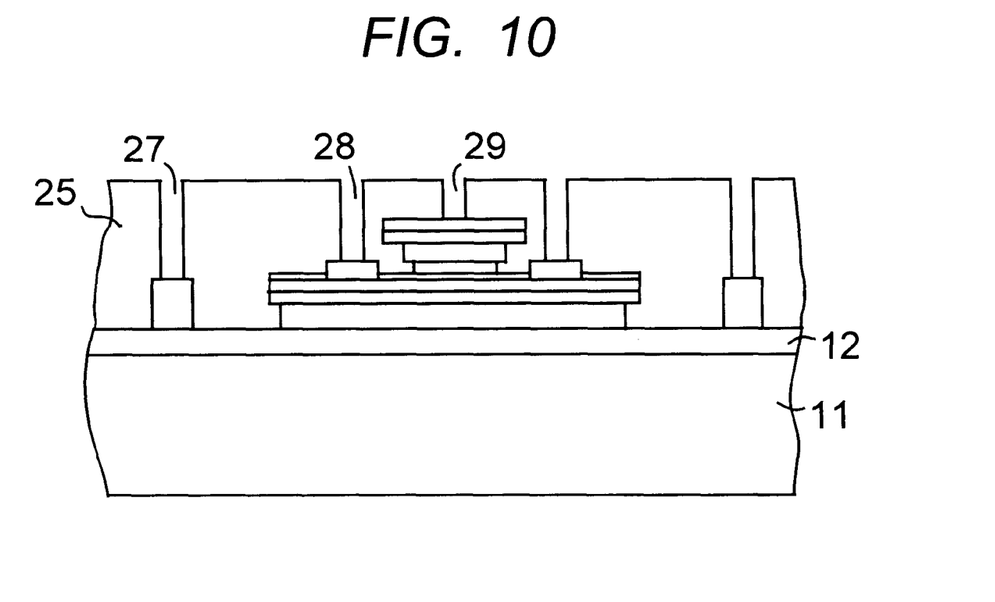
Figure 11:
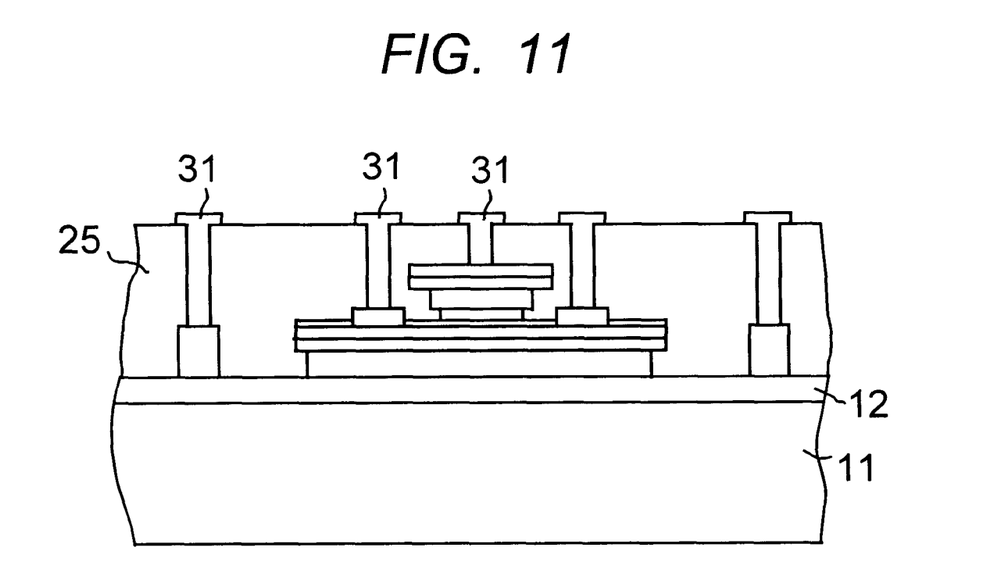

With reference to FIG. 10, the device structure is shown after completion of the encapsulant step, and after plasma etching of via holes 27, 28, and 29 through encapsulant layer 25 to the collector, base and emitter metallization respectively. Metal contacts 31–33 are evaporated into the via holes as shown in FIG. 11 to complete the device.

Several contact materials were evaluated in the above described process for the base-emitter contact 21. Thy are given in the following Table.

TABLE I

| Sample | Composition (Å) |
| --- | --- |
| A | 100 Pd/200 Pt/1000 Au |
| B | 50 Pd/200 Pt/1000 Au |
| C | 50 Pd/350 Pt/1000 Au |
| D | 50 Pd/500 Pt/1000 Au |
| E | 25 Pd/500 Pt/1000 Au |
| F | 10 Pd/500 Pt/1000 Au |
| G | 65 Pt/500 Ti/500 Pt/500 Au |

TABLE I-continued

| Sample | Composition (Å) |
| --- | --- |
| H | 50 Pd/500 Ti/500 Pt/500 Au |
| I | 25 Pd/25 Pt/500 Ti/500 Pt/500 Au |
| J | 50 Ti/500 Pt/1000 Au |
| K | 50 AuBe (10%)/500 Pt/1000 Au |

The metals used in these multilayer systems were chosen because they are effective conductors and are compatible metallurgically with each other and with the III-V semiconductor materials used for the DHBT devices. Pt and Ti tend to have a fairly flat diffusion profile when annealed at 300° C. Although Pd and Au have rougher diffusion profiles, they may also be suitable if they are used as thin layers. Moreover, Pt is an excellent diffusion barrier to Au under normal processing temperatures ( e.g. 300° C.) provided it is thick enough to avoid pinholes or other defects. The inclusion of a Pt layer allows Au to be used as the top metal for all of the subsequent interconnects.

Figure 12:
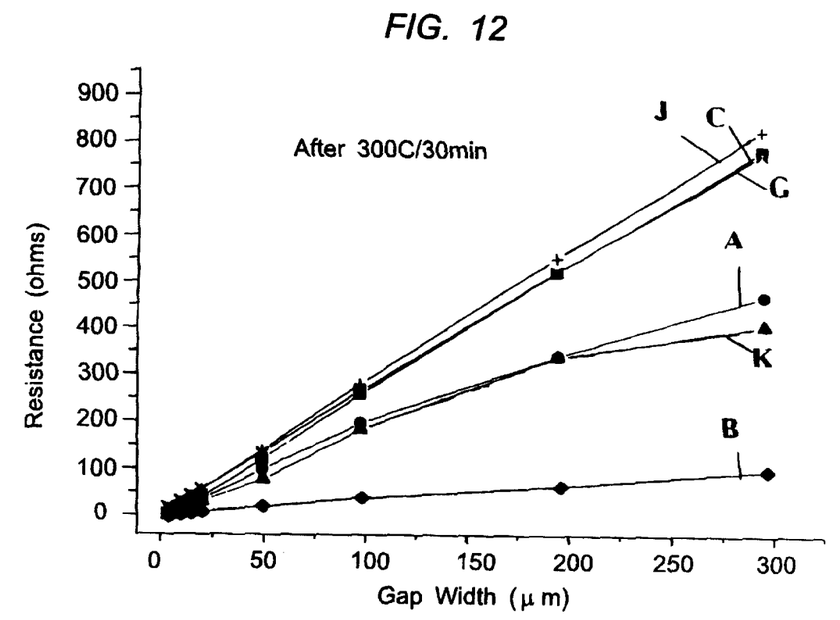
FIGS. 12–15 are plots giving various analytical data for different contact metal systems evaluated for the process of the invention.

The materials in Table I were evaluated in the DHBT structure described using transmission line measurements (TLMs) on the base region to determine the contact resistance ($R_C$) and sheet resistance ($R_S$) after annealing. TLMs were performed on devices which had the sample contact material deposited on the graded quaternary layers on top of a 500 Å base structure. Any non-linearity in the TLM data indicated that the metal had also contacted the collector region of the device. The TLM data for samples A, B, C, G, H and K are shown in FIG. 12, with resistance plotted vs. a gap width of 4–300 μm for 200×75 μm pads. Large-area devices were fabricated on structures with some of the sample contact materials, and with a base layer thickness varying from 200 Å to 500 Å, to determine base-collector leakage before and after annealing. Small area devices were fabricated with the optimum base contact materials to obtain RF measurements. The TLM data were obtained after annealing the samples at 300° C. in increments of 10 min. each to simulate the spin-on-glass curing cycles. $R_C$ and $R_S$ were determined from these measurements for all of the contact material compositions.

Figure 13:
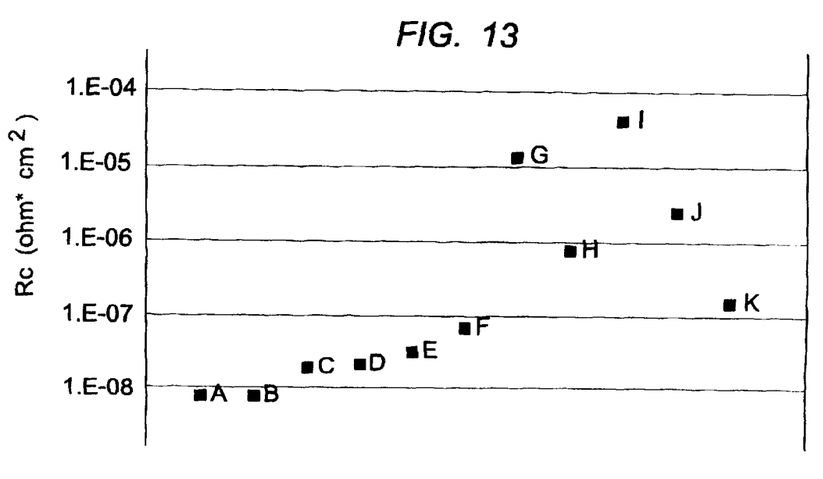

The data shown in FIG. 12 shows that for samples A, B, and K the metal has made contact to the collector region, as indicated by the slope of the line. The value for Rs in these cases is inaccurate. Sample materials C, G, and J, on the other hand did not contact the collector region. The slope for these lines is roughly parallel and $R_S$ can be accurately calculated. FIG. 13 shows the minimum $R_C$ obtained for each sample contact material. This data shows that materials G,H,I and J did not diffuse far enough to penetrate the graded quaternary layers sufficiently to make low resistance contact to the base region. Therefore the diffusion depth for these layers was between 0 Å and 140 Å.

Rutherford Backscattering (RBS) measurements were evaluated next. The RBS measurements were performed on samples with metal deposited on InGaAs both before and after annealing at 300° C. for 30 min. to determine the diffusion depth profiles. The RBS measurements on samples before annealing were used as controls to determine the initial metal thickness. The RBS measurements were performed using a National Electrostatics Corp. 3SH1MV tandem accelerator with a Charles Evans and Associates 400 end station. Data acquisition and reduction was performed using HYPRA™ software. RBS spectra were acquired at a background scattering angle of 160° with the sample perpendicular to the incident ion beam using a He ion beam energy of 2.275 MeV. Spectra were taken with the sample in a "rotating random". In this orientation, inadvertent channeling of the incident ions in the III-V substrate is avoided and the signal from the substrate can be used as an internal reference. A sample is described by fitting a theoretical RBS spectrum to the experimental spectrum. A density is assumed for each layer of the model in order to present the results in units of atomic concentration vs. depth. For single element films, where the density of the material typically matches that of the bulk density, thickness accuracy is quite good. For multi-element films, HYPRA calculates a composite density for a given layer using the bulk densities and normalizing each density by the concentration of the corresponding element. The RBS spectra are fit by applying a theoretical model and iteratively adjusting elemental concentrations until good agreement is found between the theoretical curve and experimental spectrum. Depth accuracy was estimated to be ±50 Å. Since Pt and Au are indistinguishable with RBS, the initial Pt thickness and its resulting depth profile were assumed from the initial thickness of both the Au and Pt layers.

Figure 14:
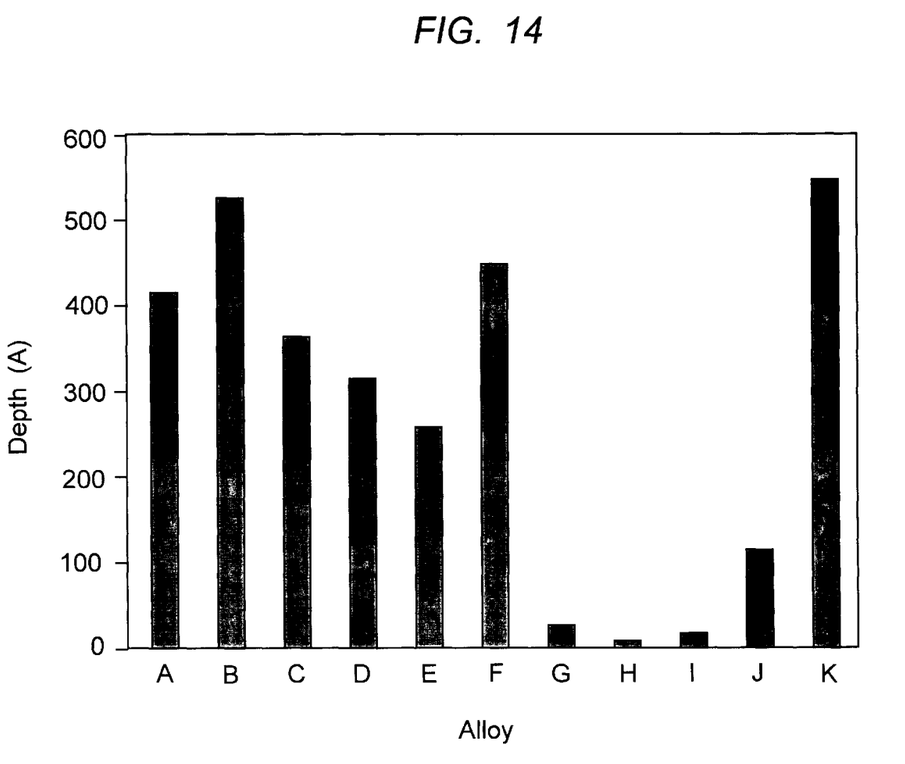

FIG. 14 shows the total diffusion depth for the various contact materials. The RBS depth profiles and TLM data agree well. The RBS data confirms that contact materials G,H,I, and J did not diffuse far enough to penetrate through the graded quaternary layers and make low resistance contact to the p$^+$ InGaAs base region. Contact materials B and K diffused too far, more than 500 Å, and made contact to the collector region. The RBS data is not fine enough to differentiate between contact materials A and C. However, the TLM data indicates that contact material A has penetrated into the collector region. For contact materials A and B, the Au top layer has most likely penetrated the Pt barrier layer. For material sample F the Pd layer is apparently too thin to ensure good results. The contact material of sample C, D, and E yielded the best results.

On the basis of these studies Pd/Pt/Au was determined to be the optimum contact material for the emitter-base contact in buried junction DHBT devices. The lowest $R_C$ obtained for this contact material was in the low $10^{-7}$ $\Omega cm^2$ range. The diffusion depth for this contact material system goes through a minimum around 25 Å to 50 Å of Pd, and then starts to increase. This is most likely due to competing alloys formed between Pd, Pt, and InGaAsP, e.g. PtAs$_2$, PtGa, PtIn, Pd$_5$ (InP)$_2$ and Pd$_5$ (GaAs)$_2$. If there is sufficient Pd to alloy with the Pt, the Pt alloys may be avoided, resulting in a smoother diffusion profile. As noted from the RBS data, the Pd and Pt were always found at the same depth after annealing.

Based on these results, the thickness of the Pd layer in the multilayer base contact material should be in the range 25–75 Å and preferably 25–50 Å. The thickness of the Pt layer should be at least 300 Å, and preferably in the range 350–600. In this thickness range Pt is an excellent diffusion barrier to the Au top layer.

It should be evident that while the material used initially in the multilayer contact can be defined with some precision, the material remaining after the anneal and diffusion is an undetermined alloy of Pd-Pt-Au.

Several DHBT structures with a base thickness of 200 Å to 500 Å were evaluated using the optimum base contact material as determined above. TLM test patterns on the base region and large-area devices were fabricated and measured both before and after annealing. The 400 Å and 500 Å base width DHBTs were fabricated using 50 Pd/500 Pt/1000 Au base electrodes. The 200 Å and 300 Å base DHBTs were fabricated with 50 Pd/500 Ti/500 Pt/500 Au electrodes, since the diffusion depth for this material should be fairly shallow. Table II shows the DC gain and base $R_S$ obtained for these structures.

TABLE II

| Thickness (Å) | Gain | $R_s$ ($\Omega/\square$) |
|---|---|---|
| 200 | 1100 | 1950 |
| 300 | 500 | 1160 |
| 400 | 200 | 700 |
| 500 | 120 | 500 |

Figure 15:
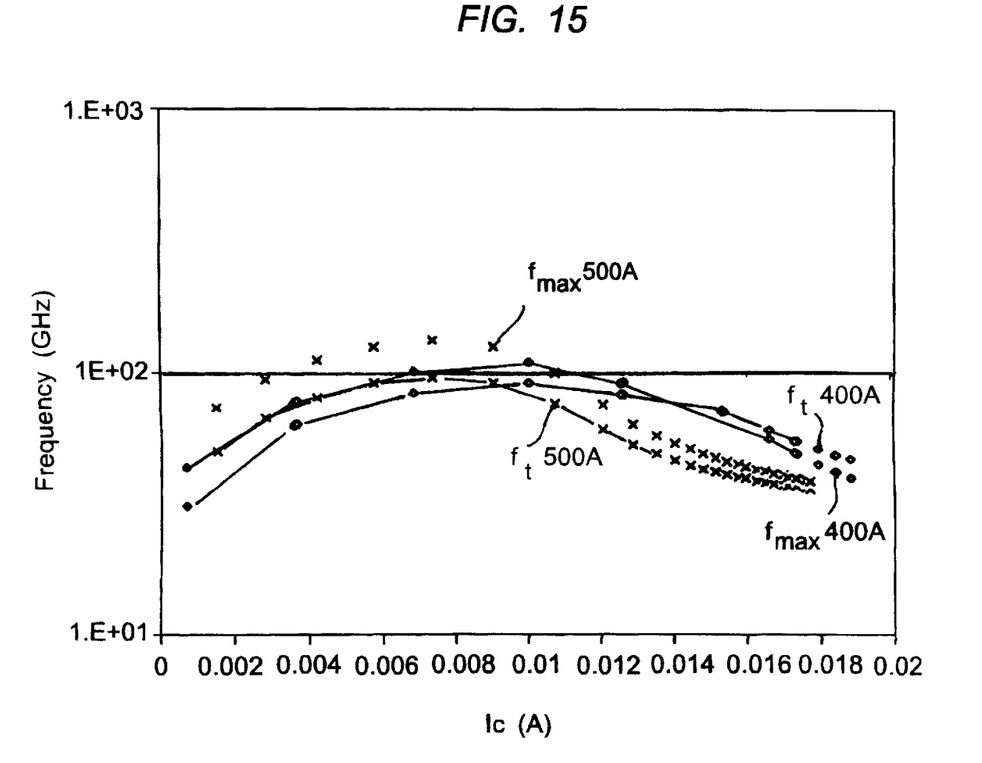

Small devices were then fabricated. FIG. 15 shows the microwave data obtained for the 400 Å and 500 Å base DHBTs, peak $f_t$=91 and $f_{max}$=109, and $f_t$=89 and $f_{max}$=127 were obtained, respectively, at a Vce of 2 V.

The heat treatment found most effective for diffusing the multilayer contact material of the invention was approximately 300° C. for approximately 30 minutes. Heating times and temperatures can vary substantially and still yield acceptable results. A temperature range of 175–350° C. is preferred, and time periods of 10–30 minutes would be typical. The heating technique used in the processes described here was a conventional anneal to take advantage of the heating steps already present in the process sequence, i.e. the encapsulant curing steps(s). However, other heating techniques can also be used, e.g. Rapid Thermal Annealing (RTA).

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A III-V double heterostructure bipolar transistor device comprising:
   a. an InP substrate,
   b. a semiconductor collector contact layer on said InP substrate,
   c. a semiconductor collector layer on said semiconductor collector contact layer
   d. a semiconductor base layer on said semiconductor collector layer,
   e. a semiconductor graded emitter-base layer on said semiconductor base layer,
   f. a semiconductor emitter layer on a portion of said semiconductor graded emitter-base layer leaving a base contact region on said semiconductor graded emitter-base layer spaced from said semiconductor emitter layer,
   g. a semiconductor emitter contact layer on said semiconductor emitter layer, and
   h. a base contact on said base contact region extending through said semiconductor graded emitter-base layer to contact said base layer, said base contact comprising an alloy of Pd, Pt and Au.

2. The device of claim 1 in which the semiconductor substrate is InP.

3. The device of claim 1 in which the semiconductor of the emitter and base is InGaAs.

4. The device of claim 1 in which the semiconductor emitter InGaAs is n-doped.

5. A III-V double heterostructure bipolar transistor device comprising:

a. an InP substrate,
b. a semiconductor collector contact layer on said InP substrate,
c. a semiconductor collector layer on said semiconductor collector contact layer,
d. a semiconductor base layer on said semiconductor collector layer,
e. a semiconductor graded emitter-base layer on said semiconductor base layer,
f. a semiconductor emitter layer on a portion of said semiconductor graded emitter-base layer leaving a base contact region on said semiconductor graded emitter-base layer spaced from said semiconductor emitter layer,
g. a semiconductor emitter contact layer on said semiconductor emitter layer, and
h. a base contact on said base contact region extending through said semiconductor graded emitter-base layer to contact said base layer, said base contact made by depositing a multilayer base contact material on the exposed portion of said semiconductor graded emitter base layer, said multilayer base contact material comprising a first contact material layer of Pd with a thickness in the range 25 Å to 75 Å, a second contact material layer of Pt with a thickness in the range 300 Å to 600 Å, and a third contact material layer of Au with a thickness of at least 300 Å, and heating said multilayer base contact material to diffuse said multilayer base contact material through said semiconductor graded emitter base layer and into contact with said semiconductor base layer.

6. The device of claim 5 in which the semiconductor substrate is InP.

7. The device of claim 6 in which the semiconductor of the emitter and base is InGaAs.

8. The device of claim 7 in which the semiconductor emitter InGaAs is n-doped.

9. The device of claim 8 in which the semiconductor collector is n-type InP.

* * * * *